(12) United States Patent
Pekin et al.

(10) Patent No.: US 6,466,038 B1
(45) Date of Patent: Oct. 15, 2002

(54) NON-ISOTHERMAL ELECTROMIGRATION TESTING OF MICROELECTRONIC PACKAGING INTERCONNECTS

(75) Inventors: Senol Pekin, San Jose, CA (US); Sunil A. Patel, Los Altos, CA (US)

(73) Assignee: LSI Logic Corporation, Milpitas, CA (US)

( * ) Notice: Subject to any disclaimer, the term of this patent is extended or adjusted under 35 U.S.C. 154(b) by 1 days.

(21) Appl. No.: 09/727,427

(22) Filed: Nov. 30, 2000

(51) Int. Cl.[7] ................................................ G01R 31/26
(52) U.S. Cl. ........................ 324/719; 324/537; 324/717; 324/158.1
(58) Field of Search ................................ 324/719, 717, 324/718, 158.1, 765, 537

(56) References Cited

U.S. PATENT DOCUMENTS

| | | | | |
|---|---|---|---|---|
| 5,479,104 A | * | 12/1995 | Cambell | ...................... 324/690 |
| 5,497,076 A | * | 3/1996 | Kuo et al. | ............... 324/719 X |
| 5,514,974 A | * | 5/1996 | Bouldin | ....................... 324/763 |
| 5,532,600 A | * | 7/1996 | Hoshino | ...................... 324/537 |
| 5,627,101 A | * | 5/1997 | Lin et al. | ................. 324/765 X |
| 5,786,705 A | * | 7/1998 | Bui et al. | ................ 324/719 X |
| 6,136,619 A | * | 10/2000 | Ceuinck et al. | ................ 438/18 |
| 6,291,984 B1 | * | 9/2001 | Wong et al. | ................. 324/132 |
| 6,293,698 B1 | * | 9/2001 | Alvis | ...................... 324/719 X |

OTHER PUBLICATIONS

Milne, A. G. and Bauer, C. L. "Voids Associated with Electromigration in Metal Lines" Solid State Electronics, vol. 34, No. 7, 1991, pp. 741–746.*
Pasco, R.W. and Scwartz, "Temperature Ramp Resistance Analysis to Characterize Electromigration", Solid State Electronics, vol. 25, No. 5, pp. 445–452, 1983.*
Root, Bryan J. and Turner Tim, "Wafer Level Electromigration Tests for Production Monitoring", IEEE/IRPS, pp. 100–107, 1985.*
Jones, Robert E. and Smith, Larry D., "A new Wafer–Level Isothermal Joule–heated Electromigration Test for Rapid Testing of Integrated Circuit Interconnect" J. Appl. Phys., May 1, 1987, pp. 119–127.*
Bauer, C. L. and Tang, P. F., "Electromigration in Thin Films" Defect and Diffusion Forum, vol. 66–69, 1989, pp. 1143–1152.*

* cited by examiner

*Primary Examiner*—N. Le
*Assistant Examiner*—T. R. Sundaram
(74) *Attorney, Agent, or Firm*—Fitch, Even, Tabin & Flannery

(57) ABSTRACT

A method for measuring electromigration includes the steps of measuring a corresponding voltage increase across an interconnect as a function of time for a plurality of nonzero heating rates and calculating an interconnect integrity from the voltage increase.

17 Claims, 4 Drawing Sheets

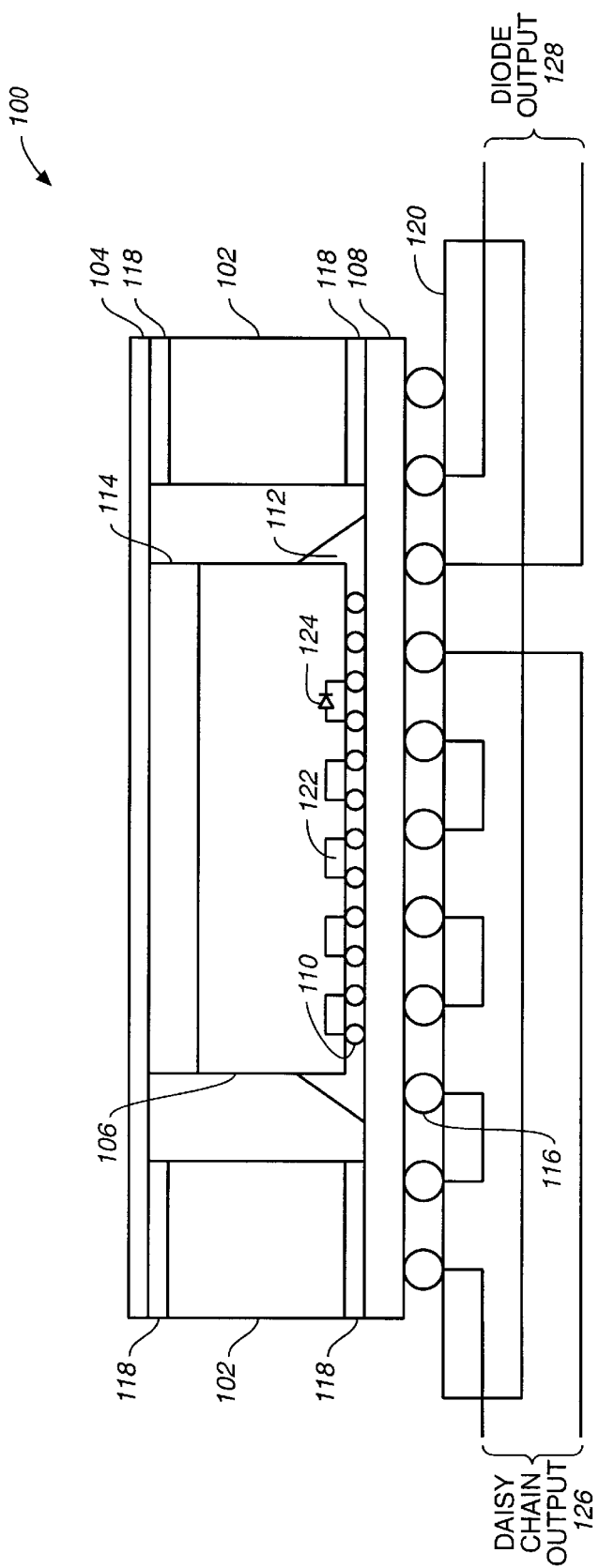
FIG._1

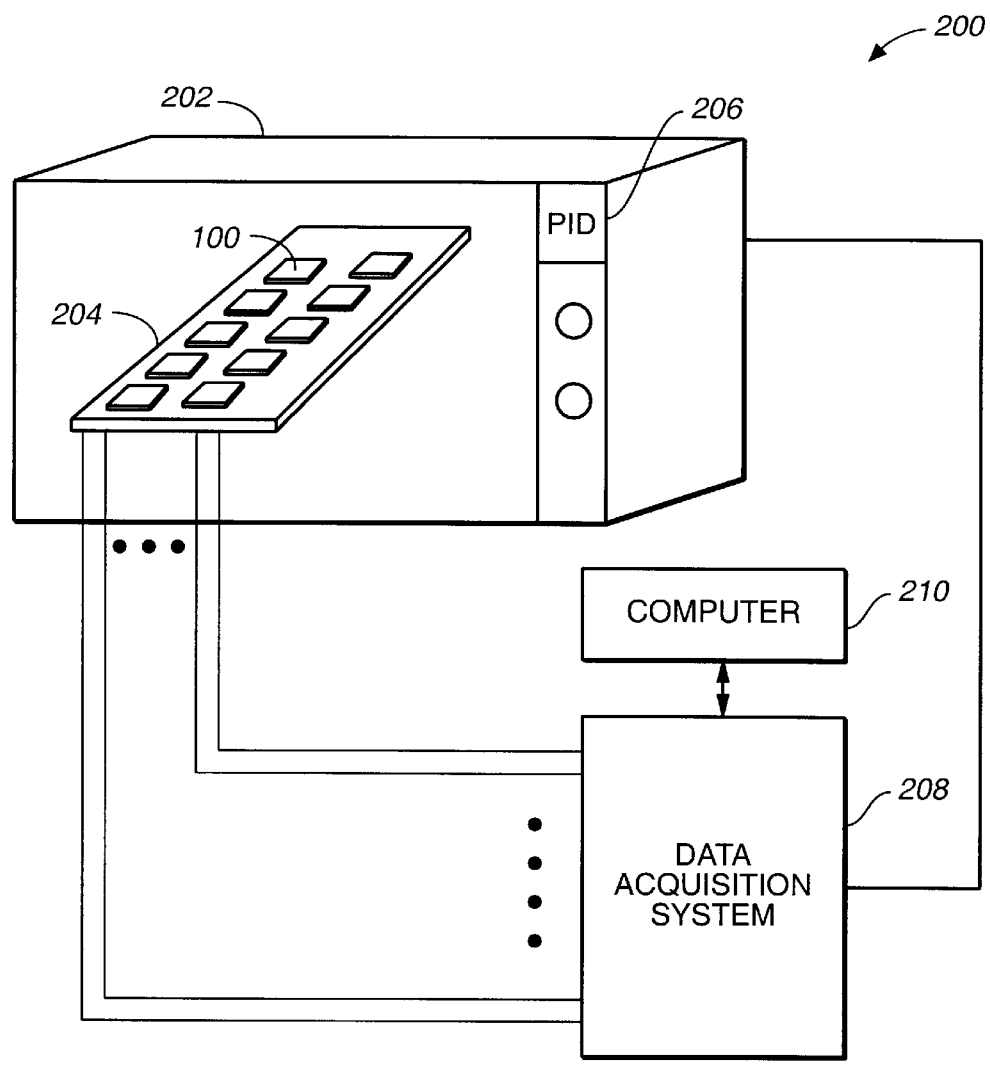
FIG._2

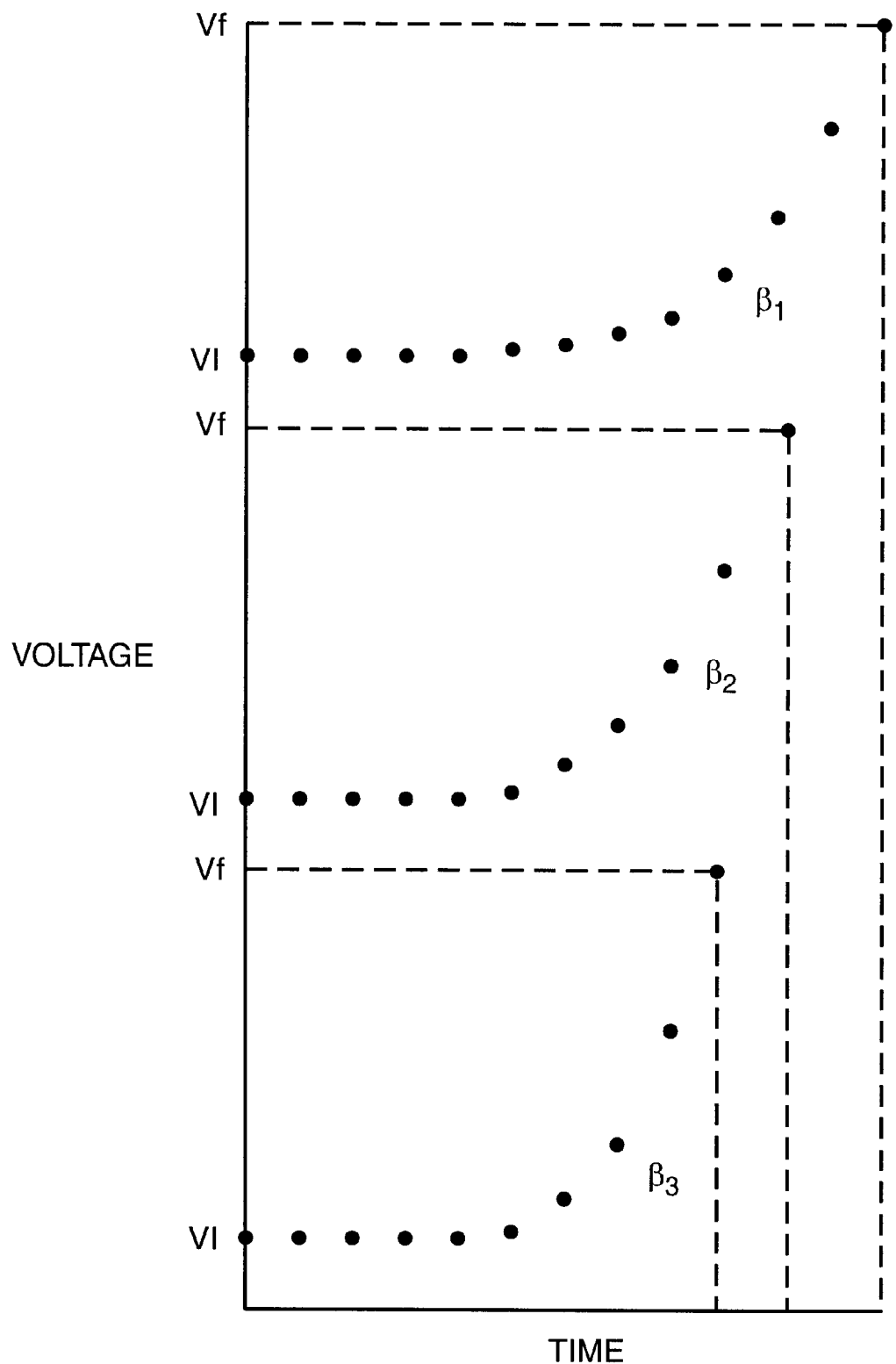
FIG._3

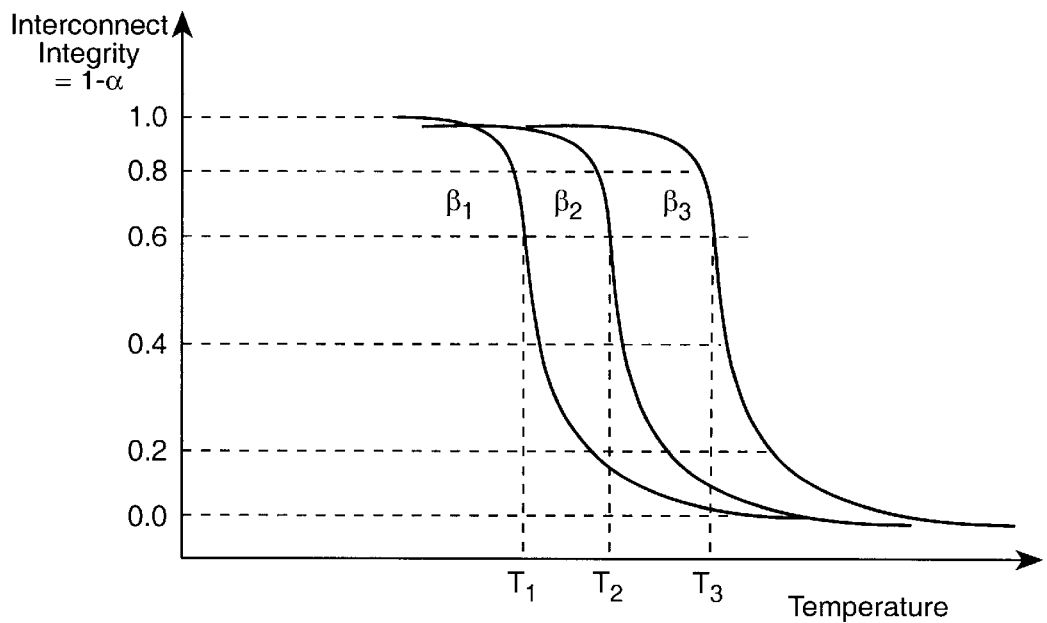
FIG._4
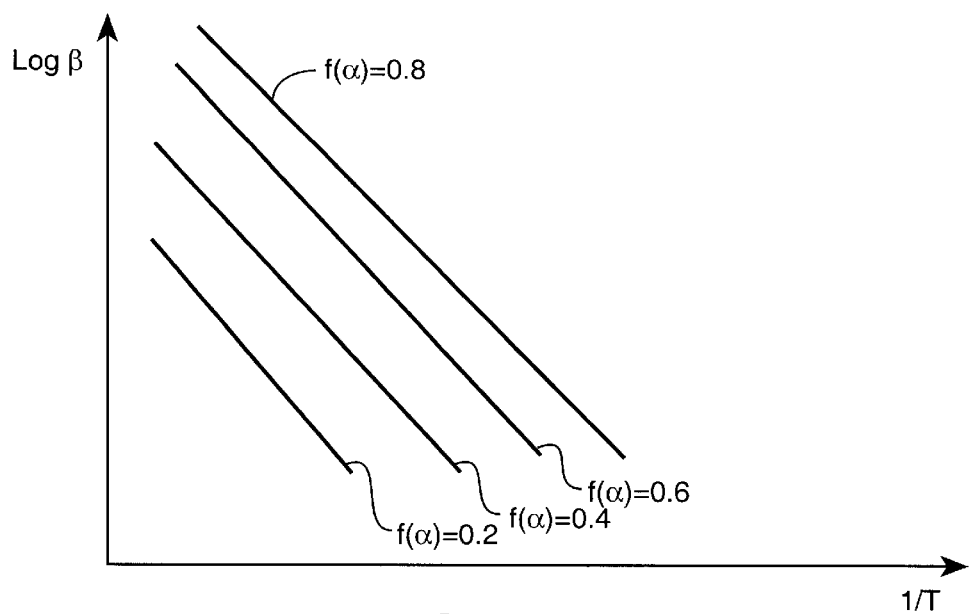
FIG._5

NON-ISOTHERMAL ELECTROMIGRATION TESTING OF MICROELECTRONIC PACKAGING INTERCONNECTS

BACKGROUND OF THE INVENTION

The present invention relates generally to testing of microelectronic packaging. More specifically, but without limitation thereto, the present invention relates to measuring degradation of microelectronic package interconnects due to current flow and elevated temperature, particularly due to electromigration.

An important issue in microelectronic packaging is reliability. Technologies for microelectronic packaging are developed not only to manufacture microelectronic packages at low cost, but also to ensure that the performance of the microelectronic packages will not deteriorate over their service life. One of the limiting factors of the service life of a microelectronic package is electromigration. Electromigration is the mass transport of atoms within metal interconnects of a microelectronic package due to momentum transfer between conduction band electrons and diffusing metal atoms. Since the invention of the first integrated circuits in the 1960's, electromigration has been a major problem, and accelerated testing is still needed to determine whether a microelectronic package design will continue to function properly over its service life. Even accelerated testing may require more than a year, which substantially impacts marketing of new devices. Also, the costs of these tests may exceed $100,000 per year, excluding the investment in equipment. A faster method of testing microelectronic package interconnects is needed to fully exploit the market value of new devices.

SUMMARY OF THE INVENTION

The present invention advantageously addresses the needs above as well as other needs by providing an expedient method and apparatus for measuring electromigration.

In one embodiment, the invention may be characterized as a method for measuring electromigration that includes the steps of measuring a corresponding voltage increase across an interconnect as a function of time for a plurality of nonzero heating rates and calculating an interconnect integrity from the voltage increase.

In another embodiment, the invention may be characterized as an apparatus for measuring electromigration that includes a current source for generating a current through an interconnect; a controlled heat source coupled to the interconnect for heating the interconnect at a selected nonzero heating rate from a selected initial temperature; and a voltage measurement device coupled to the interconnect for measuring a voltage across the interconnect.

The features and advantages summarized above in addition to other aspects of the present invention will become more apparent from the description, presented in, conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a cross-sectional view of a typical flip chip ball grid array package for measuring electromigration according to an embodiment of the present invention;

FIG. 2 is a diagram of an apparatus for measuring electromigration using the flip chip ball grid array test package of FIG. 1;

FIG. 3 is a plot of voltage across an interconnect as a function of time and temperature at selected nonzero heating rates according to a method embodying the present invention;

FIG. 4 is a plot of interconnect integrity as a function of interconnect temperature calculated from the voltage plot of FIG 3; and FIG. 5 is a plot of heating rate as a function of interconnect temperature and interconnect integrity calculated from the plot of FIG. 4.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a cross-sectional view of a typical flip chip ball grid array (FCBGA) package 100. Shown are a stiffener 102, a heat spreader 104, a die 106, a laminated substrate 108, wafer bumps 110, an underfill 112, a thermally conductive adhesive 114, solder balls 116, a stiffener adhesive 118, an interposer 120, jumpers 122, a diode 124, a daisy chain output 126, and a diode output 128.

The FCBGA package 100 is mounted on the interposer 120 during electromigration testing. The test die 106 is electrically connected to the substrate 108 by the wafer bumps 110, which are typically made of a eutectic solder. The jumpers 122 are formed on the test die 106 between each pair of wafer bumps 110 for connecting the wafer bumps in series. The test diode 124 is connected between one pair of wafer bumps 110 for measuring the temperature of the die 106. The substrate 108 connects the wafer bumps 110 to the solder balls 116. The flip chip ball grid array package 100 is mounted on the interposer 120 by the solder balls 116.

In conventional methods for testing wafer bump interconnect electromigration, a constant current is passed through the wafer bumps 110 by the daisy chain output connecting the wafer bumps 110 in series through the interposer 120 and the test die 106. It is believed that as the current passes through the wafer bumps, momentum is transferred from electrons to the solder metal atoms, resulting in the migration of the solder metal atoms. As the solder metal atoms migrate, they leave behind vacancies that coalesce to form voids. The voids decrease the cross-sectional area of the wafer bump, increasing the wafer bump electrical resistance. The increased electrical resistance of the wafer bump results in a higher voltage drop across the wafer bump. The voltage drop across the wafer bumps increases until it results in a failure of the die mounted on the package. The service life of the wafer bumps is measured by the mean time to failure (MTTF).

A popular method for testing interconnect electromigration uses Black's equation. Black found that the mean time to failure (MTTF) of an interconnect may be expressed as a function of current density and temperature as $$MTTF^{-1} = BJ^n \exp\left(-\frac{E}{kT}\right) \quad (1)$$

where B is Black's constant (for B=1, MTTF is due solely to current and temperature), J is the current density, n is a material constant approximately equal to 2, E is the activation energy for electromigration, k is Boltzmann's constant ($1.38 \times 10^{-23}$ Joules per atom per degree Kelvin) and T is absolute temperature. In this approach, several tests are conducted at constant current densities and constant temperatures. From the MTTF values measured by these tests, the values for the material constant n and the activation energy E are calculated. Using the calculated values for n and E, equation (1) may be used to predict the mean time to failure at the service current density and temperature.

Disadvantageously, long test cycles are required to measure the mean time to failure (MTTF) even using accelerated values for the current densities and temperatures. In contrast to methods that determine the activation energy from the mean time to failure, the embodiments of the present invention described below determine activation energy non-isothermally as a function of heating rates, advantageously avoiding the long test cycles required by the isothermally accelerated measurements of the mean time to failure. The activation energy may then be substituted into equation (1) to solve for the mean time to failure using a much faster test cycle. An exemplary method and apparatus for finding the activation energy for electromigration non-isothermally using heating rates is described below.

The degradation of a microelectronic package interconnect may be expressed as a function of the voltage drop across the interconnect by the formula $$\alpha = \frac{V_i - V}{V_i - V_f} \quad (2)$$

where $\alpha$ is the extent of degradation, $V_i$ is the initial voltage drop across the interconnect at an initial time when a constant current begins to flow through the interconnect, V is the voltage drop measured at a time during which electromigration has occurred in the interconnect, and $V_f$ is the final voltage drop measured at the end of the failure test.

FIG. 2 is a diagram of an apparatus 200 for measuring interconnect electromigration in the flip chip ball grid array package of FIG. 1. Shown are ten flip chip ball grid array test packages 100, a test oven 202, a test circuit board 204, a proportional integral derivative temperature controller 206, a data acquisition system 208, and a computer 210.

The ten flip chip ball grid array test packages 100 are mounted on the test circuit board 204 and placed inside the test oven 202. The number ten was selected as a statistical sample for averaging, however larger or smaller samples may also be used to suit specific applications. The test oven 202 is a controlled heat source for heating the test circuit board 204 and may be, for example, an Espec Model PH-301. The temperature and heating rate of the test oven 202 are controlled by the proportional integral derivative temperature controller 206, for example, a Eurotherm Model 818P. The daisy chain output 126 and the diode output 128 of each of the ten flip chip ball grid array test packages 100 are connected from the test circuit board 204 to the data acquisition system 208. The data acquisition system 208 may be, for example, a Keithley Model 2700 Multimeter/Data Acquisition System. The proportional integral derivative temperature controller 206 and the computer 210 are also connected to the data acquisition system 208 for controlling the temperature of the test oven 202 and for calculating the activation energy of each of the ten flip chip ball grid array test packages 100.

In operation, the computer 210 commands the proportional integral derivative temperature controller 206 to establish an initial temperature of the test oven 202 via the data acquisition system 208. The data acquisition system 208 outputs a selected low current, typically about 1 ma, through the diode outputs of each of the flip chip ball grid array test packages 100 and measures the voltage across each diode output. The computer 210 inputs the diode voltage measurements from the data acquisition system 208 and compares each measured voltage to a calibration table of voltage vs. temperature for each of the test diodes 124 to determine the temperature of the die 106 of each of the flip chip ball grid array test packages 100.

Once the initial temperature is reached, the computer 210 commands the data acquisition system 208 to generate a selected high current, typically about 436 ma to provide a current density of about $10^4$ A/cm$^2$ for daisy chain packages presently in use. The selected high current flows through the daisy chain outputs of each of the 10 flip chip ball grid array test packages 100. The computer 210 commands the data acquisition system 208 to measure the initial voltage drop $V_i$ through each daisy chain output and commands the test oven 202 to heat the flip chip ball grid array test packages 100 from the initial temperature at a nonzero heating rate $\beta = dT/dt$ so that the temperature of the wafer bumps of the flip chip ball grid array test packages 100 increases with time.

While the selected high current is flowing through the daisy chain outputs, the computer 210 commands the data acquisition system 208 to measure the voltage of the daisy chain outputs of each of the flip chip ball grid array test packages 100 as a function of time and temperature. The die temperature measured by the test diode outputs 128 is typically five to six degrees centigrade higher than the oven temperature due to local Joule heating at the wafer bumps 110 as they conduct the selected high current. The computer 210 calculates an average of the daisy chain output voltages and an average of the diode output voltages from each of the 10 flip chip ball grid array (FCBGA) packages 100. Each of the 10 FCBGA packages 100 has a daisy chain of typically 10 wafer bumps 110. The same measurements are repeated for several values of $\beta$ using the same apparatus 200 and/or by running the tests in parallel using replicas of the apparatus 200.

FIG. 3 is a typical plot of the averaged voltage V across each daisy chain having, for example, 10 wafer bumps 110 as a function of time at selected nonzero heating rates $\beta_1$, $\beta_2$, and $\beta_3$, where $\beta_3 > \beta_2 > \beta_1$. The initial temperature is typically the ambient or room temperature. The final temperature is typically 145 degrees Centigrade. The times required to reach the final temperature are determined by the heating rates $\beta_1$, $\beta_2$, and $\beta_3$ respectively. Consequently, the time to reach the failure voltage $V_f$ increases as $\beta$ decreases, given the same initial temperature. As $\beta$ approaches zero, which would be the case for isothermal testing, the time required to reach the failure voltage approaches a maximum. In contrast to isothermal testing techniques in which the oven temperature is held constant during the test period, this method increases the oven temperature with time according to each of the selected heating rates $\beta_1$, $\beta_2$, and $\beta_3$, thus affording the advantage of reducing the time required for the test cycle. The computer 210 uses the voltage measurements for each corresponding heating rate to calculate the normalized coefficient of degradation $\alpha$ according to formula (2) for each of the nonzero heating rates $\beta_1$, $\beta_2$, and $\beta_3$ as a function of the interconnect temperature T. The integrity of the interconnect may be expressed as a function of the degradation $\alpha$ by the formula $$f(\alpha) = 1 - \alpha \quad (3)$$

FIG. 4 is a plot of the interconnect integrity $f(\alpha)$ as a function of interconnect temperature T calculated by the computer 210 from the voltage plot of FIG. 3 for each of the nonzero heating rates $\beta_1$, $\beta_2$, and $\beta_3$. At lower temperatures, the interconnect integrity $f(\alpha)$ approaches unity for all heating rates, but at higher temperatures, the degradation of the interconnect becomes apparent. At each selected value of $f(\alpha)$, for example, 0.6, the corresponding interconnect temperatures $T_1$, $T_2$, and $T_3$ are different for each of the nonzero heating rates $\beta_1$, $\beta_2$, $\beta_3$.

FIG. 5 is a plot of the natural logarithm of the heating rate $\beta$ as a function of the reciprocal of the interconnect temperature T ($T^{-1}$) and the corresponding interconnect integrity function $f(\alpha)$ calculated from the plot of FIG. 4 by the computer 210 after several test measurements. The computer 210 uses the log $\beta$ vertical scale and the 1/T horizontal scale to assist in the calculation of the activation energy E. For each corresponding value of $f(\alpha)$, the computer 210 plots the natural logarithm of each of the nonzero heating rates $\beta_1$, $\beta_2$, and $\beta_3$ vs. the reciprocal of the interconnect temperature $T^{-1}$. The computer 210 then connects the plotted values for the nonzero heating rates $\beta_1$, $\beta_2$, and $\beta_3$ by well known curve fitting techniques for each selected value of $f(\alpha)$ to produce isoconversional lines.

If the isoconversional lines are straight, parallel lines as shown in the example of FIG. 5, then the activation energy E does not change with the extent of the degradation $\alpha$ or with the interconnect temperature T (assuming constant values for $\beta_1$, $\beta_2$, and $\beta_3$). On the other hand, if the isoconversional lines are not straight lines, then the activation energy E changes as a function of temperature, indicating multiple failure mechanisms such as melting of the interconnect material. The inflection point of the isoconversional lines defines the interconnect temperature range and heating rate parameters that determine how fast the electromigration tests may be accelerated to calculate the service life of the interconnects.

If the isoconversional lines have different slopes, then the activation energy E changes with the extent of the degradation $\alpha$, also indicating multiple failure mechanisms as the cause of interconnect degradation.

The activation energy for electromigration E may be calculated from the plot of FIG. 5 by the equation $$E = \frac{\Delta \ln \beta}{\Delta T^{-1}} \cdot \frac{R}{0.457} \quad (4)$$

where $$\frac{\Delta \ln \beta}{\Delta T^{-1}}$$

is the slope of an isoconversional line measured from FIG. 4 and R is the gas constant 8.314 Joules per mole per degree Kelvin. The activation energy E calculated from equation (4) may then be substituted into equation (1) to solve for the mean time to failure (MTTF) using n=2 as follows:

$$MTTF = \left[BJ^2 \exp\left(-\frac{E}{kT}\right)\right]^{-1} \quad (5)$$

The method for non-isothermal testing for flip chip ball grid array (FCBGA) packages explained above therefore affords several advantages, such as greatly shortening test cycle time, indicating the degree to which the testing may be accelerated, and indicating whether multiple failure mechanisms are present.

Other modifications, variations, and arrangements of the present invention may be made in accordance with the above teachings other than as specifically described to practice the invention within the spirit and scope defined by the following claims.

What is claimed is:

1. An apparatus for measuring electromigration comprising:
   a high current source for generating a current through an interconnect;
   a heat source for heating the interconnect from an initial temperature to a final temperature for a plurality of selected nonzero heating rates;
   an interconnect voltage measurement device coupled to the interconnect;
   a low current source;
   a test diode coupled to the low current source for measuring an interconnect temperature;
   a test diode voltage measurement device coupled to the test diode for measuring a voltage of the test diode; and
   a computer coupled to the interconnect voltage measurement device, the test diode voltage measurement device, and the heat source for measuring a voltage across the interconnect for each of the plurality of selected nonzero heating rates, for calculating an interconnect integrity from the measured voltage for each of the plurality of selected nonzero heating rates, for generating a plot of a natural logarithm of each of the plurality of selected nonzero heating rates as a function of a reciprocal of the interconnect temperature for selected values of the interconnect integrity, and for generating from the plot a plurality of isoconversional lines having a slope representative of an activation energy.

2. The apparatus of claim 1 wherein the computer calculates a mean time between failure of the interconnect from the activation energy.

3. The apparatus of claim 1 wherein the isoconversional lines indicate multiple failure mechanisms of the interconnect.

4. The apparatus of claim 3 wherein the multiple failure mechanisms of the interconnect comprise melting of the interconnect material.

5. The apparatus of claim 1 wherein the isoconversional lines have an inflection point that defines an interconnect temperature r an a nd heating rat e parameters that determine how fast electromigration tests may be accelerated to calculate a service life of the interconnect.

6. The apparatus of claim 1 wherein the interconnect is a wafer bump.

7. The apparatus of claim 1 wherein the interconnect integrity is $1-(V_i-V)/(v_i-V_f)$ wherein $V_i$ is a voltage drop measured across the interconnect at an initial time, $V_f$ is a voltage drop measured across the interconnect at a final time, and V is a voltage drop measured across the interconnect at a time during which electromigration has occurred in the interconnect.

8. The apparatus of claim 1 wherein the selected values of the interconnect integrity are approximately 0.2, 0.4, 0.6, and 0.8.

9. A method for measuring electromigration comprising the following steps:
   generating a selected current through an interconnect;
   measuring a voltage across the interconnect;
   heating the interconnect while measuring the voltage across the interconnect for a plurality of selected nonzero heating rates;

calculating an interconnect integrity from the measured voltage for each of the plurality of selected non-zero heating rates;

measuring an interconnect temperature while measuring the voltage across the interconnect;

generating a plot of a natural logarithm of each of the plurality of selected nonzero heating rates as a function of a reciprocal of the interconnect temperature for selected values of the interconnect integrity; and generating from the plot a plurality of isoconversional lines having a slope representative of an activation energy.

10. The method of claim 9 further comprising the step of calculating the activation energy from the slope of the isoconversional lines.

11. The method of claim 10 further comprising the step of calculating a mean time to failure of the interconnect as a function of the activation energy.

12. The method of claim 9 further comprising the step of detecting multiple failure mechanisms of the interconnect from the isoconversional lines.

13. The method of claim 9 further comprising the step of finding an interconnect temperature range and heating rate parameters for accelerated testing of the interconnect from an inflection point of the isoconversional lines.

14. The method of claim 9 wherein the interconnect is a wafer bump.

15. The method of claim 9 wherein the interconnect integrity equals $1-(V_i-V)/(V_i-V_f)$ wherein $V_i$ is a voltage drop measured across the interconnect at an initial time, $V_f$ is a voltage drop measured across the interconnect at a final time, and V is a voltage drop measured across the interconnect at a time during which electromigration has occurred in the interconnect.

16. The method of claim 9 wherein the selected values of the interconnect integrity are approximately 0.2, 0.4, 0.6, and 0.8.

17. The method of claim 12 wherein the multiple failure mechanisms of the interconnect comprise melting of the interconnect material.

* * * * *